US009263368B2

(12) United States Patent
Oh et al.

(10) Patent No.: US 9,263,368 B2
(45) Date of Patent: Feb. 16, 2016

(54) SEMICONDUCTOR DEVICE AND METHOD OF MANUFACTURING THE SAME

(71) Applicant: SK hynix Inc., Gyeonggi-do (KR)

(72) Inventors: Sung Lae Oh, Chungcheongbuk-do (KR); Chang Man Son, Gyeonggi-do (KR); Sang Hyun Sung, Gyeonggi-do (KR); Jin Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 25 days.

(21) Appl. No.: 14/222,304

(22) Filed: Mar. 21, 2014

(65) Prior Publication Data

US 2015/0069616 A1    Mar. 12, 2015

(30) Foreign Application Priority Data

Sep. 9, 2013 (KR) .................. 10-2013-0107828

(51) Int. Cl.
*H01L 23/12* (2006.01)
*H01L 23/48* (2006.01)
*H01L 21/768* (2006.01)

(52) U.S. Cl.
CPC .......... *H01L 23/48* (2013.01); *H01L 21/76897* (2013.01); *H01L 2924/0002* (2013.01)

(58) Field of Classification Search
CPC ............... H01L 29/7926; H01L 27/11582; H01L 27/11575; H01L 27/11573; H01L 29/66833
See application file for complete search history.

(56) References Cited

U.S. PATENT DOCUMENTS

| 8,587,052 | B2 * | 11/2013 | Yun et al. ........................ 257/324 |
| 8,953,376 | B2 * | 2/2015 | Nam et al. .................. 365/185.11 |
| 9,082,483 | B2 * | 7/2015 | Oh et al. ................................ 1/1 |
| 2014/0048945 | A1 * | 2/2014 | Lim et al. ...................... 257/773 |
| 2014/0110795 | A1 * | 4/2014 | Oh et al. ........................ 257/401 |
| 2015/0069616 | A1 * | 3/2015 | Oh et al. ........................ 257/773 |

FOREIGN PATENT DOCUMENTS

| KR | 101087476 | 11/2011 |
| KR | 1020130015616 | 2/2013 |

* cited by examiner

*Primary Examiner* — Jarrett Stark
(74) *Attorney, Agent, or Firm* — IP & T Group LLP

(57) ABSTRACT

A semiconductor device includes a substrate on which a plurality of contact regions are defined, a plurality of transistors formed in the plurality of contact regions, a support body formed over the plurality of transistors and including a top surface, portions of which have different heights in the plurality of contact regions, a plurality of stacked structures including a plurality of conductive layers stacked over the support body, slits located between the plurality of stacked structures, first lines coupled to first junctions of the plurality of transistors through the slits, and second lines coupled to second junctions of the plurality of transistors through the slits.

20 Claims, 18 Drawing Sheets

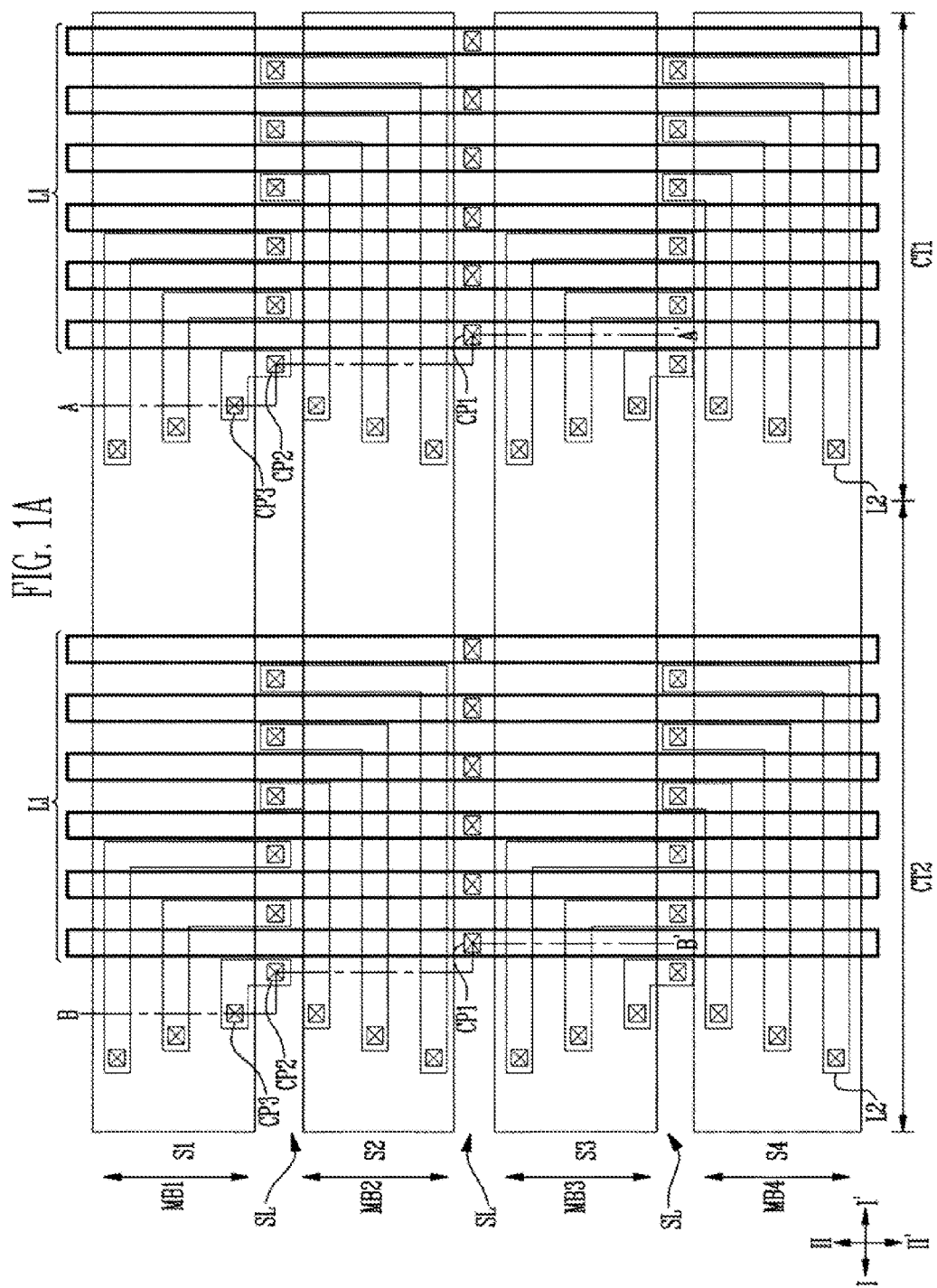

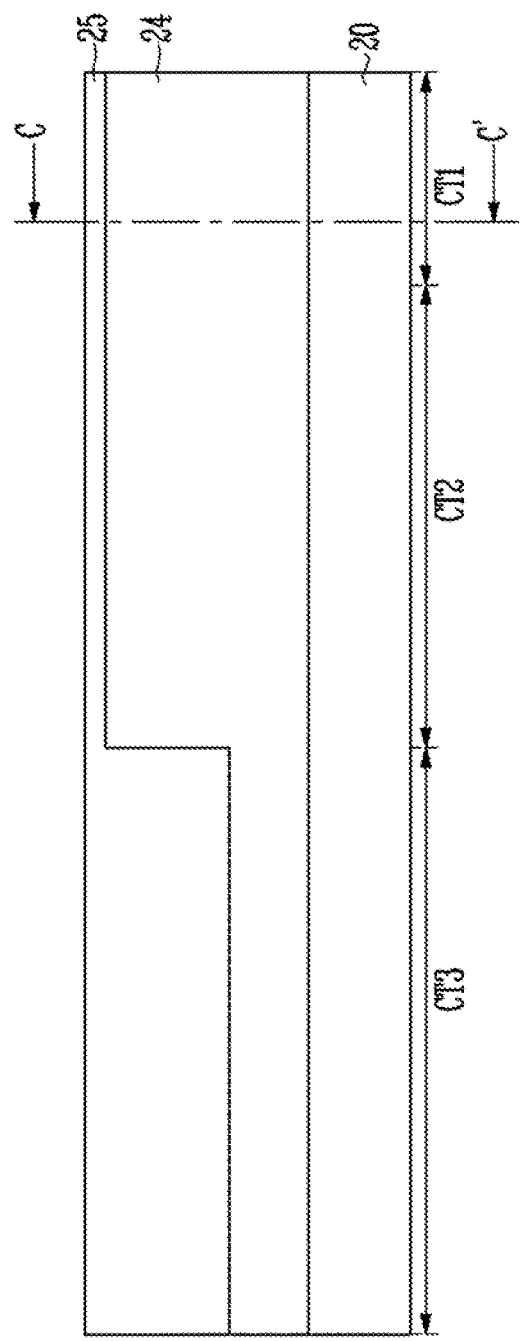

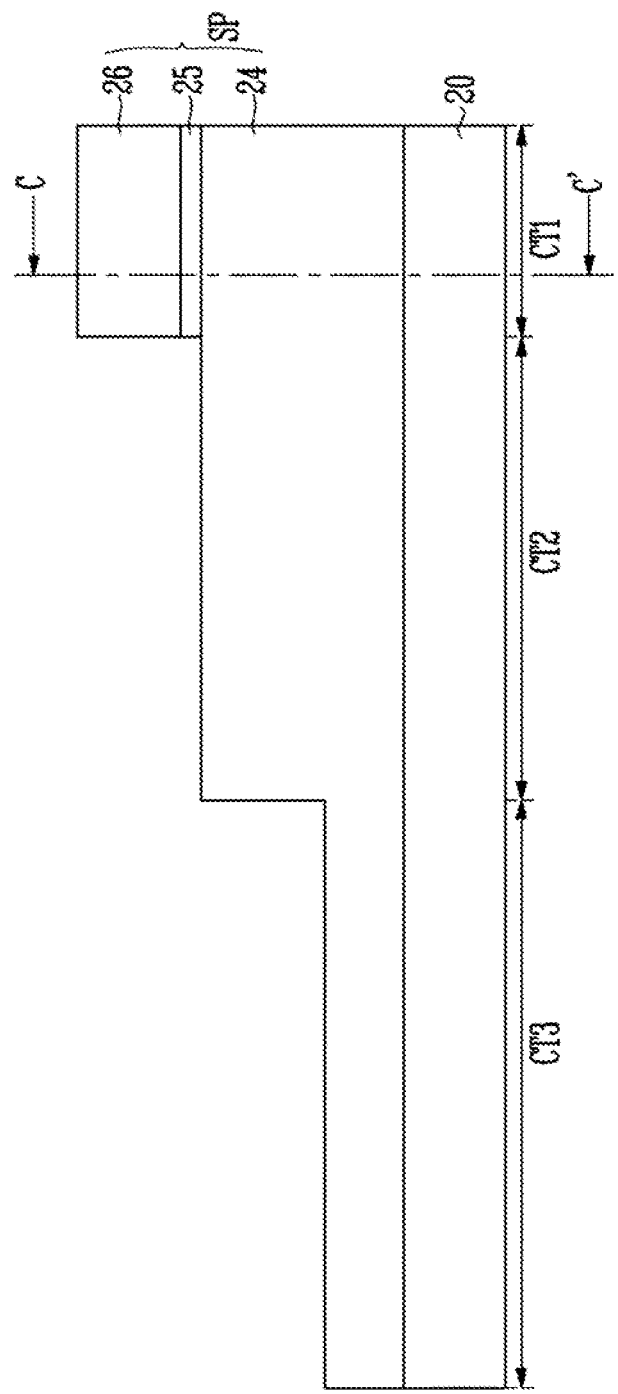

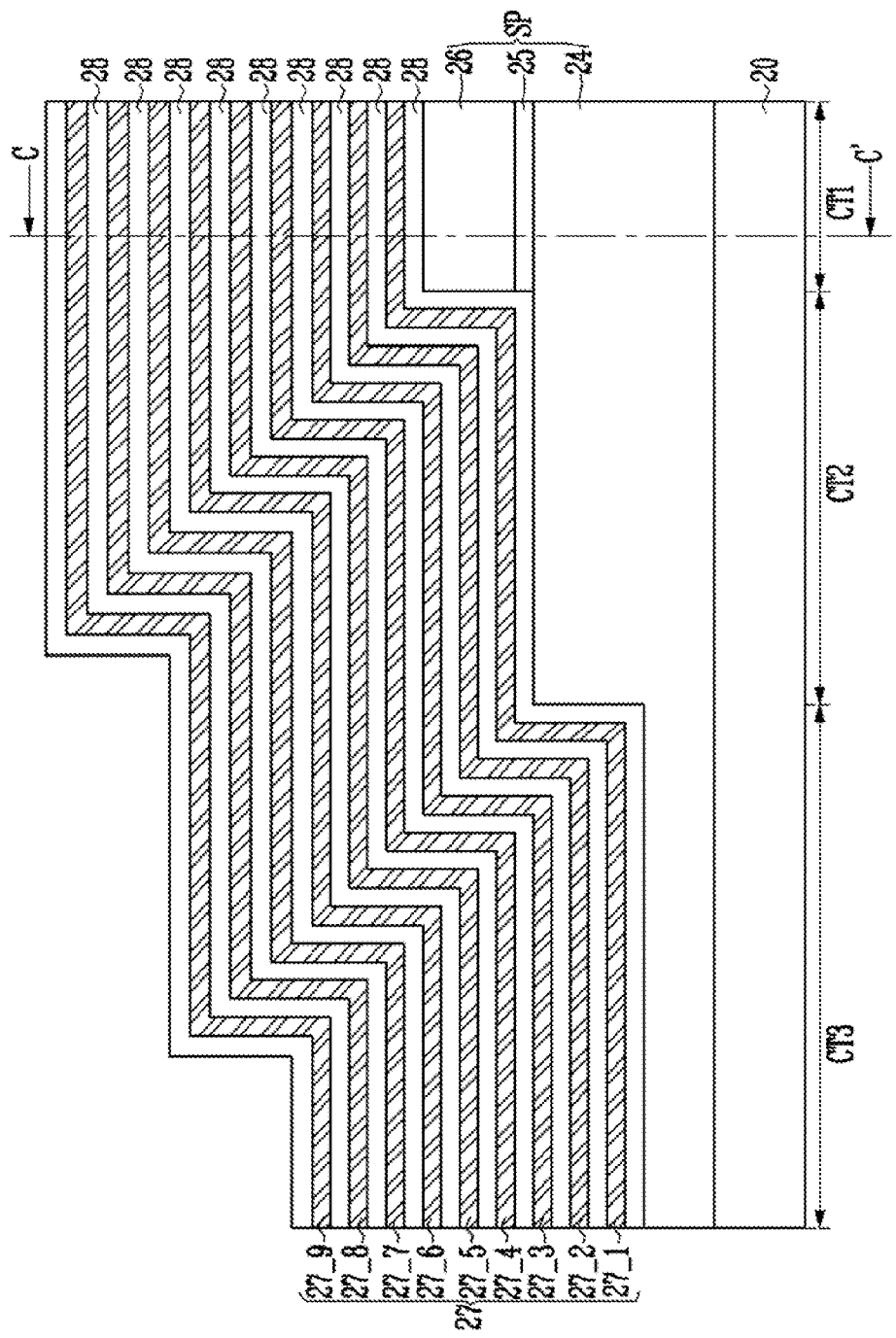

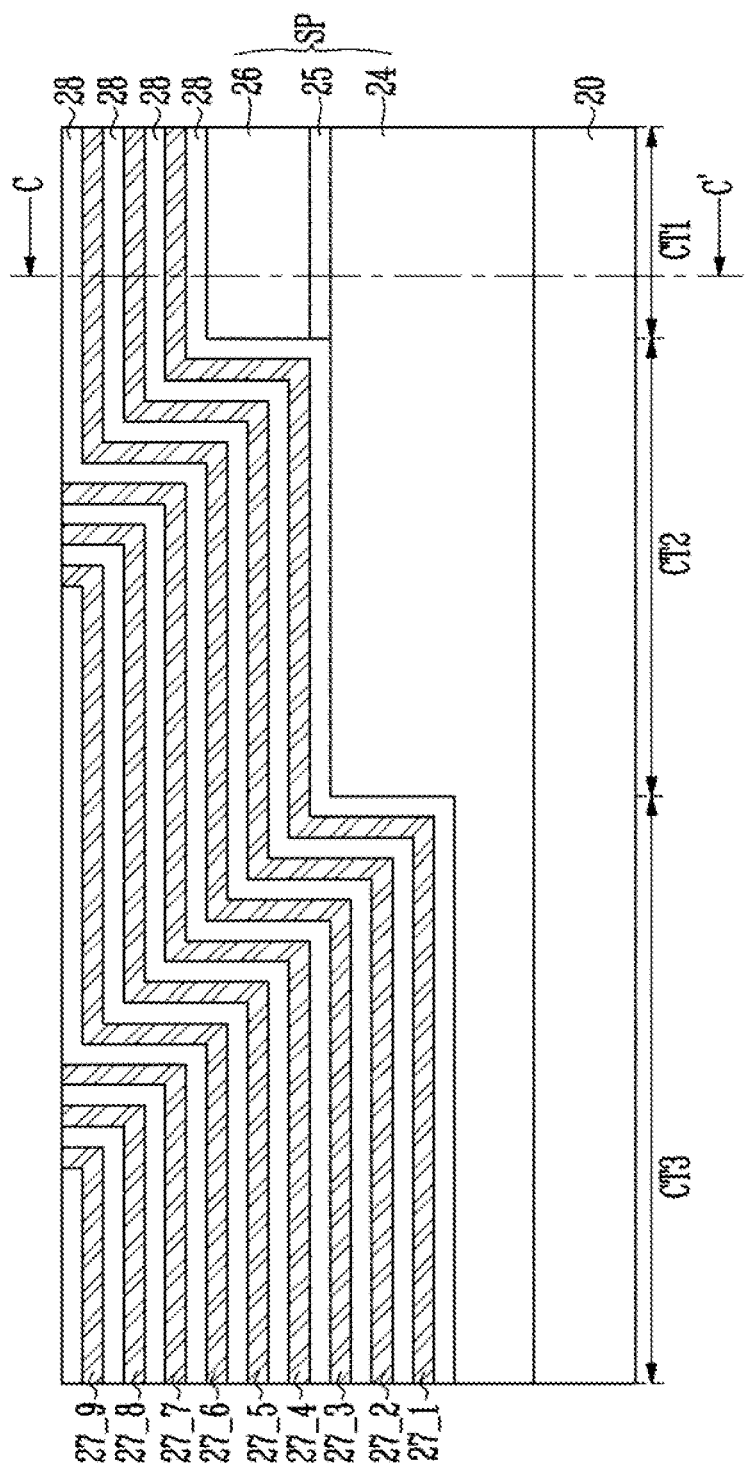

SEMICONDUCTOR DEVICE AND METHOD OF MANUFACTURING THE SAME

CROSS-REFERENCE TO RELATED APPLICATION

The present application claims priority to Korean patent application number 10-2013-0107828 filed on Sep. 9, 2013, in the Korean Intellectual Property Office, the entire disclosure of which is incorporated by reference herein.

BACKGROUND

1. Technical Field

Various embodiments relate generally to an electronic device and a method of manufacturing the same and, more particularly, to a semiconductor device including three-dimensionally stacked memory cells and a method manufacturing the same.

2. Related Art

A non-volatile memory device preserves the stored data even when the power is cut off. Two-dimensional memory devices in which memory cells are fabricated in a single layer over a silicon substrate have reached physical limits in increasing their degree of integration. Accordingly, three-dimensional (3D) non-volatile memory devices in which memory cells are stacked in a vertical direction over a silicon substrate have been proposed.

A conventional 3D non-volatile memory device includes a plurality of word lines that are stacked on top of one another. Therefore, in order to select a desired one of the stacked word lines, a plurality of contact plugs may be formed so that each of the contact plugs may be coupled to each of the word lines. To this end, conventionally, the stacked word lines may be patterned into a stepped shape, and subsequently, the plurality of contact plugs may be formed. However, it may be difficult to pattern word lines into a stepped shape, and the number of processes may increase as the number of stacked word lines increases.

The conventional 3D non-volatile memory device may include global word lines and local word lines in order to apply a voltage to the stacked word lines and pass transistors in order to apply a voltage to the desired word line. However, since the pass transistors are formed over a substrate, a separate area for these pass transistors needs to be provided. Therefore, the memory device may be limited in increasing its integration degree.

BRIEF SUMMARY

Various embodiments relate to a semiconductor device allowing for easy manufacture and having an increased degree of integration, and a method of manufacturing the same.

A semiconductor device according to an embodiment of the present invention may include a substrate on which a plurality of contact regions are defined, a plurality of transistors formed in the plurality of contact regions, a support body formed over the plurality of transistors and including a top surface, portions of which have different heights in the plurality of contact regions, a plurality of stacked structures including a plurality of conductive layers stacked over the support body, slits located between the plurality of stacked structures, first lines coupled to first junctions of the plurality of transistors through the slits, and second lines coupled to second junctions of the plurality of transistors through the slits.

A method of manufacturing a semiconductor device according to another embodiment of the present invention may include forming a plurality of transistors located in a plurality of contact regions that are formed on a substrate, forming a support body over the plurality of transistors, wherein the support body includes a top surface, portions of which have different heights in the plurality of contact regions, forming a plurality of stacked structures including a plurality of conductive layers and a plurality of insulating layers alternately stacked over the support body, wherein the plurality of stacked structures are separated by a plurality of slits from one another, forming first lines coupled to first junctions of the plurality of transistors through the plurality of slits, and forming second lines coupled to second junctions of the plurality of transistors through the plurality of slits.

BRIEF DESCRIPTION OF THE DRAWINGS

FIGS. 1A to 1D are views of a structure of a semiconductor device according to an embodiment of the present invention;

FIGS. 2A to 2B, 3A to 3B 4A to 4B, 5A to 5B, 6A to 6B, 7A to 7B, and 8A to 8B are cross-sectional views illustrating methods of manufacturing a semiconductor device according to an embodiment of the present invention;

DETAILED DESCRIPTION

Figure 1B:
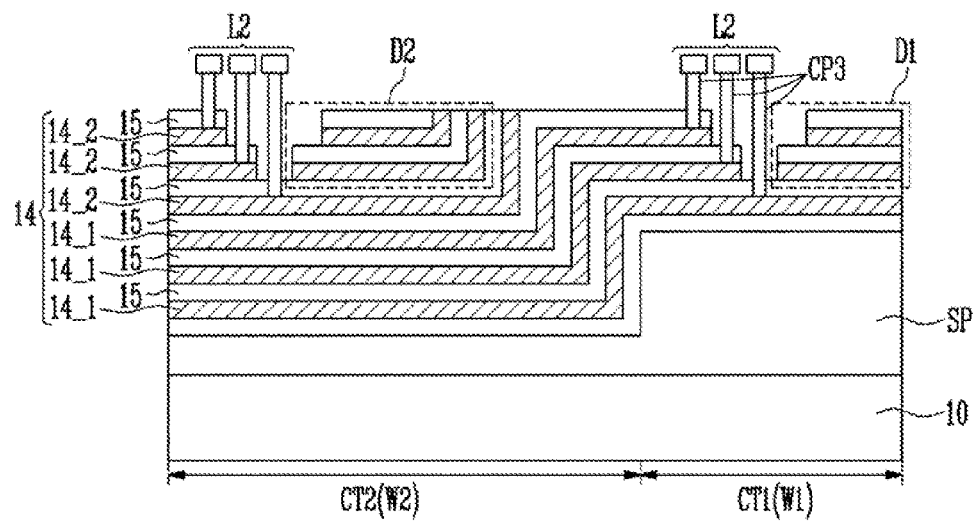

Hereinafter, various embodiments of the present disclosure will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

It should be readily understood that the meaning of "on" and "over" in the present disclosure should be interpreted in the broadest manner so that "on" means not only "directly on" but also "on" something with an intermediate feature(s) or a layer(s) therebetween, and that "over" means not only directly on top but also on top of something with an intermediate feature(s) or a layer(s) therebetween.

Figure 1C:
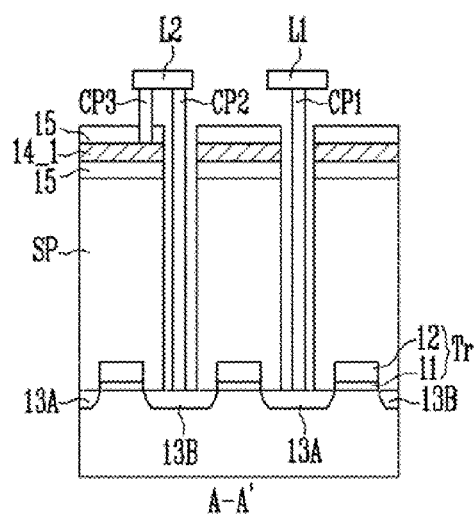
Figure 1D:
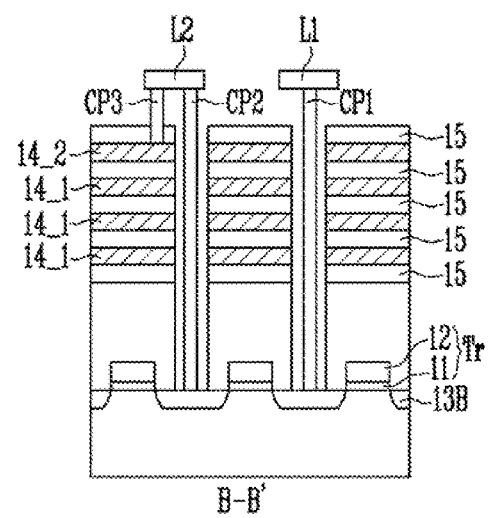

FIGS. 1A to 1D are views illustrating a structure of a semiconductor device according to an embodiment of the present invention. FIG. 1A is a layout view. FIG. 1B is a cross-sectional view taken in a direction I-I' of FIG. 1A. FIG. 1C is a cross-sectional view taken in a direction A-A' of FIG. 1A. FIG. 1D is a cross-sectional view taken in a direction B-B' of FIG. 1A.

As illustrated in FIGS. 1A to 1D, a semiconductor device may include a substrate 10, a plurality of transistors Tr, a support body SP, stacked structures S1 to S4, a plurality of slits SL, first lines L1, and second lines L2.

Memory blocks MB1 to MB4 may be defined in the substrate 10. Contact regions CT1 and CT2 may be defined on each of the memory blocks MB1 to MB4. Also, a cell region (not illustrated) may be defined on each of the memory blocks MB1 to MB3. The contact regions CT1 and CT2 are located on both sides of the cell region. In addition, when first to m-th contact regions are defined sequentially in a direction from an end of each of the memory blocks MB1 to MB4, the first to m-th contact regions may have different widths from each other. For example, a width W2 of an n+1-th contact region may be greater than a width W1 of the n-th contact region (W2>W1), where m is a natural number equal to or greater than 2 and n is a natural number satisfying $2 \leq n+1 \leq m$.

The transistors Tr may be located in the contact regions CT1 and CT2. Each of the transistors Tr may include a gate insulating layer 11 and a gate electrode 12. In addition, first and second junctions 13A and 13B may be formed in the substrate 10 on both sides of the gate electrode 12. The transistors Tr may be arranged by each of the memory blocks MB1 to MB4. Gate electrodes 12 of the transistors Tr, which are located in each of the memory blocks MB1 to MB4, may be coupled by a single gate pattern.

The support body SP may be formed over the transistors Tr and include a top surface having different heights in the contact regions CT1 and CT2. For example, the support body SP may include first to m-th top surfaces that are located in the first to m-th contact regions. An n+1-th top surface of the support body SP, which is located in the n+1-th contact region, may have a smaller height than that of an n-th top surface of the support body SB, which is located in the n-th contact region. In this example, the support body SP may have a stepped structure that rises towards the ends of the memory blocks MB1 to MB4, i.e., as distance from the cell region increases, where m is a natural number equal to or greater than 2 and n is a natural number satisfying $2 \leq n+1 \leq m$.

The stacked structures S1 to S4 may be formed over the support body SP and extend in the first direction I-I'. Each of the stacked structures S1 to S4 may include a plurality of conductive layers 14 and a plurality of insulating layers 15 that are stacked alternately on top of each other. For example, the conductive layers 14 may include first to m-th conductive layers 14 that are sequentially stacked. N-th conductive layers 14_1, among the conductive layers 14, may be patterned stepwise in the n-th contact region. N-th pad portions may be defined at ends of the n-th conductive layers 14_1. In addition, n+1-th conductive layers 14_2 that are stacked over the n-th conductive layers 14_1 among the conductive layers 14, may be patterned stepwise in the n+1-th contact region. N+1-th pad portions may be defined at ends of the n+1-th conductive layers 14_2, where m is a natural number equal to or greater than 2 and n is a natural number satisfying $2 \leq n+1 \leq m$.

The slits SL may be located between neighboring stacked structures S1 to S4. The conductive layers 14, which are included in the stacked structures S1 to S4, may be separated by the slits SL. For example, the slits SL may pass through the stacked conductive layers 14 and be formed to a depth so that the first and second junctions 13A and 13B of the transistors Tr may be exposed through the slits SL.

The first lines L1 may be coupled to first junctions 13A of the transistors Tr through the slits SL. For example, the first lines L1 may extend in a second direction II-II' crossing (substantially perpendicular to) the first direction I-I' and be coupled to the first junctions 13A through first contact plugs CP1.

The second lines L2 may be coupled to second junctions 13B of the transistors Tr through the slits SL. For example, the second lines L2 may be coupled to the second junctions 13B of the transistors Tr through second contact plugs CP2. In addition, the third contact plugs CP3 may couple the conductive layers 14 and the second lines L2 to each other. As a result, the conductive layers 14 and the second junctions 13B may be coupled to each other. For example, the second lines L2 may be located over the stacked structures S1 to S4 and extend in the first direction I-I'. In this example, the second lines L2 may be bent in the second direction II-II' so that the second lines L2 may be coupled to the second contact plugs CP2 located in the slits SL.

In this embodiment, the second lines L2 may be arranged at the same height. However, when the area is limited, the second lines L2 may be formed at different heights. In addition, the first lines L1 and the second lines L2 may be formed at different heights, and the first lines L1 may be formed over the second lines L2.

The first lines may be global word lines, the second lines L2 may be local word lines, and the conductive layers 14 may be word lines. In addition, the transistors Tr may be switch devices that couple the global word lines and the local word lines to each other.

The semiconductor device may further include dummy structures D1 and D2 that are located over the stacked structure S1 to S4. For example, an n-th dummy structure may be located in the n-th contact region and be substantially symmetrical with respect to the n-th pad portions. In addition, an n+1-th dummy structure may be located in the n+1-th contact region and be substantially symmetrical with respect to the n+1-th pad portions. The dummy structures D1 and D2 may be left when the conductive layers 14 and the insulating layers 15 are being patterned stepwise.

According to the above-described structure, since the transistors Tr are located in the contact regions CT1 and CT2 of the stacked structures S1 to S4, a degree of integration of the semiconductor device may be increased. In addition, the lines may be arranged with efficiency by coupling the first and second junctions 13A and 13B to the first and second lines L1 and L2, respectively, through the slits SL between the stacked structures S1 to S4.

FIGS. 2A to 2B, 3A to 3B, 4A to 4B, 5A to 5B, 6A to 6B, 7A to 7B, and 8A to 8B are cross-sectional views illustrating methods of manufacturing a semiconductor device according to an embodiment of the present invention. FIGS. 2B, 3B, 4B, 5B, 6B, 7B, and 8B are cross-sectional views of FIGS. 2A, 3A, 4A, 5A, 6A, and 7A, and 8A, respectively. In FIGS. 2A to 2B, 3A to 3B, 4A to 4B, 5A to 5B, 6A to 6B, 7A to 7B, and 8A to 8B, a contact region is mainly illustrated.

Figure 2B:
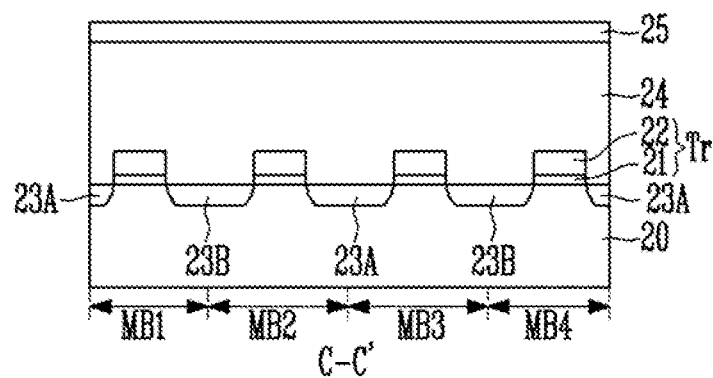

As illustrated in FIGS. 2A and 2B, a plurality of transistors Tr, each of which includes a gate insulating layer 21 and a gate electrode 22, may be formed in a contact region on a substrate 20. Subsequently, the substrate 20 may be doped with impurities on both sides of the gate electrode 22 to thereby form junctions 23A and 23B.

Subsequently, a first material layer 24, constituting a support body, may be formed to cover the plurality of transistors Tr. The first material layer 24 may be thick enough to cover the transistors Tr.

Subsequently, a mask pattern (not illustrated) may be formed over the first material layer 24, and the first mate al layer 24 may be etched to a predetermined thickness to form a stepped structure by using the mask pattern as an etch barrier. For example, the mask pattern may cover the first and second contact regions CT1 and CT2 and expose a third contact region CT3. The mask pattern may expose a portion of the second contact region CT2. The first material layer 24 may be etched to not expose the underlying transistors Tr. Subsequently, an etch stop layer 25 may be formed over the first material layer 24, and a top portion of the etch stop layer 25 may be planarized.

Figure 3B:
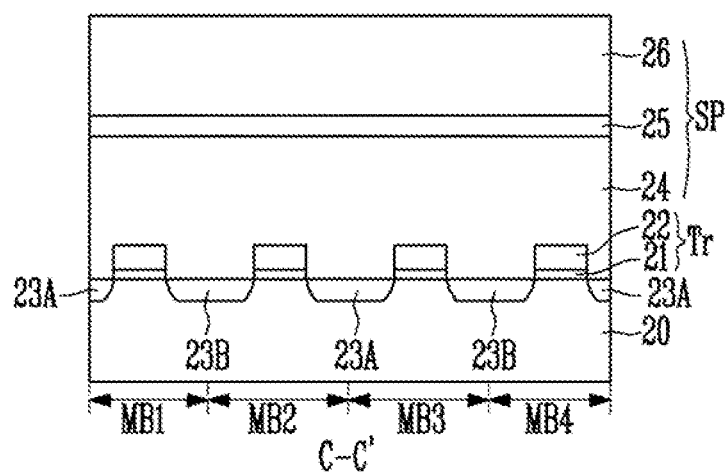

As illustrated in FIGS. 3A and 3B, a second material layer 26, constituting a support body, may be formed over the etch stop layer 25. Subsequently, the second material layer 26 may be etched using a mask pattern (not illustrated) as an etch barrier. The mask pattern may cover the first contact region CT1 and expose the second and third contact regions CT2 and CT3. The first material layer 24 may be protected by the etch stop layer 25. Subsequently, the etch stop layer 25 that is exposed by the second material layer 26 may be etched so that the etch stop layer 25 may remain, for example, only between the first material layer 24 and the second material layer 26.

As a result, the support body SP may include a top surface having different heights in the contact regions CT1 to CT3. For example, the support body SP may have a stepped shape. In this example, the support body SP may include a first support body covering the plurality of transistors Tr, a second support body formed over the first support body and having a smaller width than that of the first support body, and an etch stop layer interposed between the first support body and the second support body. In addition, the top surface of the support body SP may be higher in the first contact region CT1 than in the second contact region CT2, and the top surface of the support body SP may be higher in the second contact region CT2 than in the third contact region CT3.

In addition the first material layer 24 and the second material layer 26 may include the same material. The, etch stop layer 25 may include a material having a different etch selectivity against etch selectivities of materials of the first and second material layers 24 and 25. For example, the first and second material layers 24 and 26 may include oxide layers, and the etch stop layer 25 may include a nitride layer, an amorphous carbon layer or the like.

Processes of forming a material layer and an etch stop layer, constituting a support body, may be repeated depending on the number of contact regions CT1 to CT3 that are defined on the substrate 20. For example, when n contact regions are defined on the substrate 20, n material layers, constituting a support body, having different widths may be sequentially stacked, and etch stop layers, constituting a support body, may be interposed therebetween.

Figure 4B:
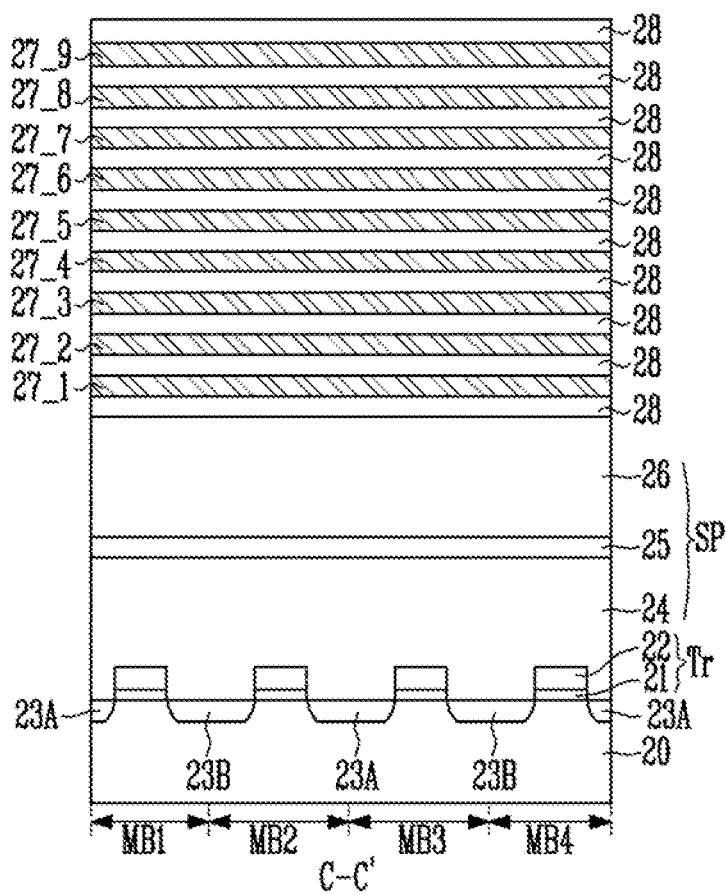

As illustrated in FIGS. 4A and 4B, a plurality of first material layers 27 and a plurality of second material layers 28 may be alternately formed over the support body SP. Since the first and second material layers 27 and 28 may be formed along the top surface of the support body SP, the first and second material layers 27 and 28 may have stepped shapes. For example, each of the first and second material layers 27 and 28 may include a horizontal portion that extends along the top surface of the support body SP and a protruding portion that extends along a side surface of the support body SP.

The first material layers 27 may be provided in order to form conductive layers such as word lines and selection lines. The second material layers 28 may be provided in order to form insulating layers that electrically insulate the stacked conductive layers from each other. The first material layers 27 may include materials having a different etch selectivity against an etch selectivity of materials of the second material layers 28. For example, the first material layers 27 may include a sacrificial layer including a nitride, and the second material layers 28 may include an insulating layer including an oxide. In another example, the first material layers 27 may include a conductive layer including polysilicon, and the second material layer 28 may include an insulating layer including an oxide. In another example, the first material layers 27 may include a conductive layer including doped polysilicon, doped amorphous silicon or the like, and the second material layers 28 may include a sacrificial layer including undoped polysilicon, undoped amorphous silicon or the like. In this embodiment, a description will be made in reference to an example in which the first material layers 27 may include sacrificial layers and the second material layers 28 may include insulating layers.

For example, in this embodiment, a description is made in reference to an example in which three contact regions CT1 to CT3 are defined on the substrate 20 and three pad portions are defined in each of the contact regions CT1 to CT3. Therefore, nine first material layers 27_1 to 27_9 and nine second material layers 28 may be alternately formed over the support body SP.

Figure 5B:
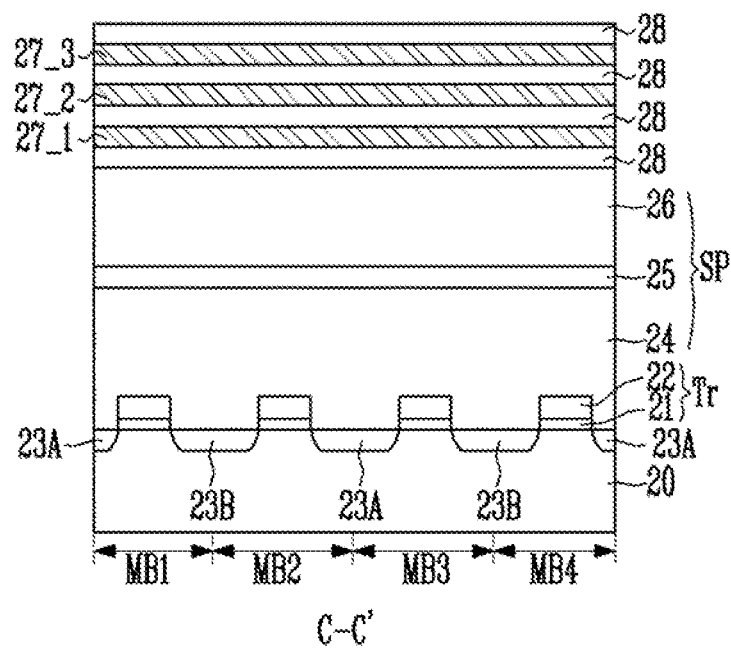

As illustrated in FIGS. 5A and 5B, a planarization process may be performed on the first and second material layers 27 and 28. The planarization process may be performed using a chemical mechanical polishing (CMP) process. In addition, before the planarization process is performed, a sacrificial layer having a sufficient thickness may be formed over the first and second material layers 27 and 28 in order to compensate for the stepped structure of the first and second material layers 27 and 28.

For example, in this embodiment, the planarization process may be performed so that a horizontal portion of the first material layers 27_1 to 27_3 may be located over the top surface in the first contact region CT1, a horizontal portion of the first material layers 27_4 to 27_6 may be located over the top surface in the second contact region CT2, and a horizontal portion of the first material layers 27_7 to 27_9 may be located over the top surface in the third contact region CT3. A protruding portion of the first material layers 27_1 to 27_3 may be located over a portion of the top surface in the first contact region CT1, a protruding portion of the first material layers 27_4 to 27_6 may be located over a portion of the top surface in the second contact region CT2, and a protruding portion of the first material layers 27_7 to 27_9 may be located over a portion of the top surface in the third contact region CT3.

Figure 6A:
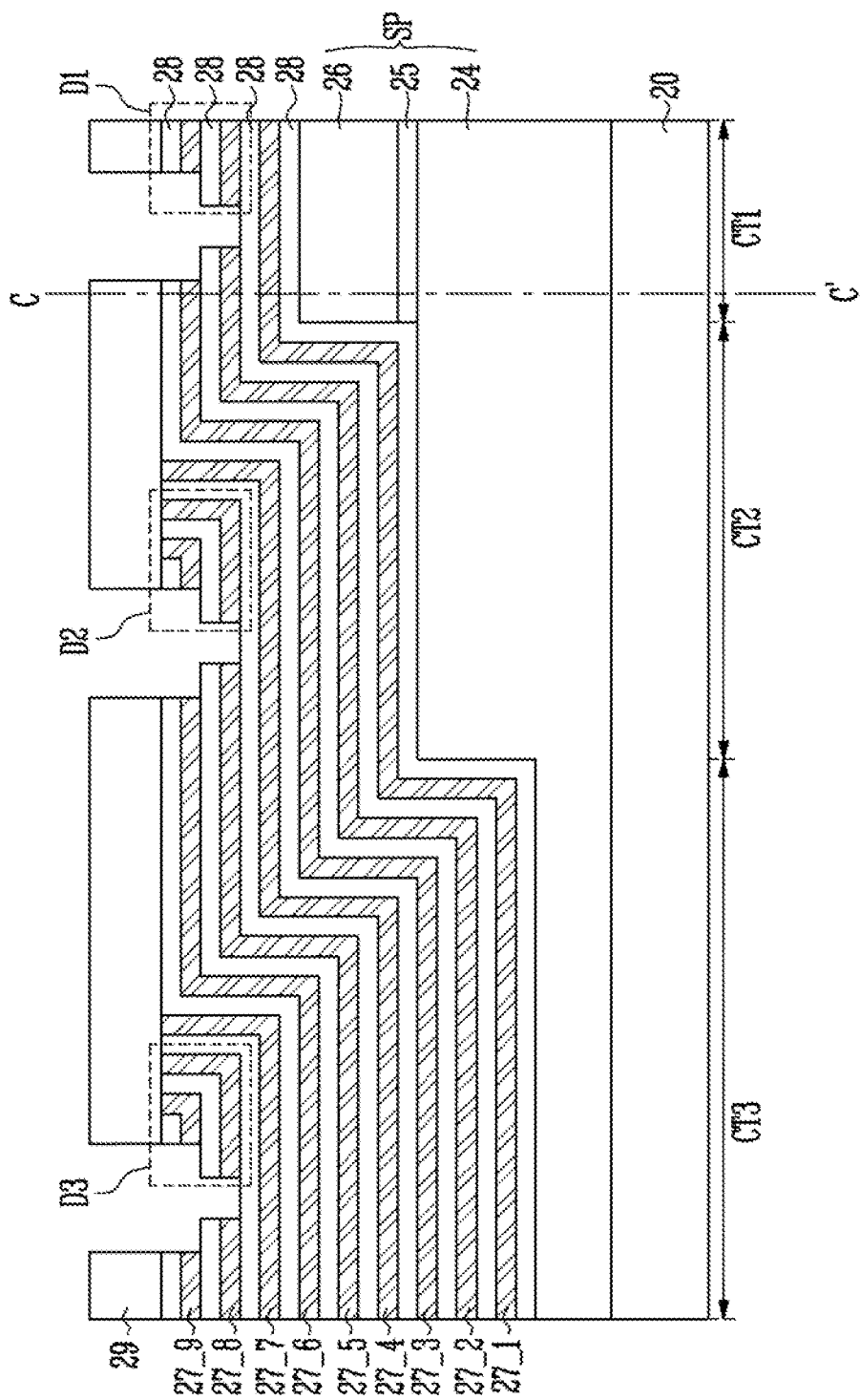
Figure 6B:
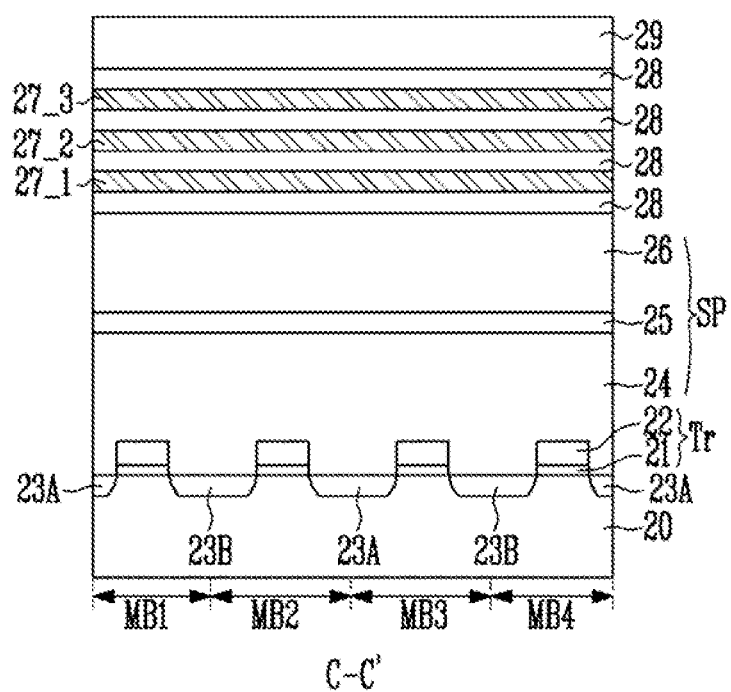

As illustrated in FIGS. 6A and 6B, a mask pattern 29 may be formed over the planarized first and second material layers 27 and 28. The mask pattern 29 may partially expose the contact regions CT1, CT2 and CT3. For example, the mask pattern 29 may be formed so that the horizontal portion of the first material layers 27_1 to 27_3 may be partially exposed in the first contact region CT1 the horizontal portion of the first material layers 27_4 to 27_6 may be partially exposed in the second contact region CT2, and the horizontal portion of the first material layers 27_7 to 27_9 may be partially exposed in the third contact region CT3.

Subsequently, at least one first material layer 27 and at least one second material layer 28 may be etched using the mask pattern 29 as an etch barrier. Thereafter, the mask pattern 29 may be reduced, and at least one first material layer 27 and at least one second material layer 28 may be etched using the reduced mask pattern 29 as an etch barrier. By repeating these processes, the first and second material layers 27 and 28 may be stepped in the contact regions CT1 to CT3. For example, the first material layers 27_1 to 27_3 may be stepped in the first contact region CT1 the first material layers 27_4 to 27_6 may be stepped in the second contact region CT2, and the first material layers 27_7 to 27_9 may be stepped in the third contact region CT3.

While the first and second material layers 27 and 28 are being patterned stepwise, dummy structures D1 to D3 may be formed in the contact regions CT1 to CT3, respectively. For example, while the first material layers 27_1 to 27_3 are being patterned stepwise in the first contact region CT1 ends of the first material layers 27_1 to 27_3 may be removed to form the first dummy structure D1. In substantially the same manner, ends of the first material layers 27_4 to 27_6 may be removed from the second contact region CT2 to form the second dummy structure D2, and ends of the first material layers 27_7 to 27_9 may be removed from the third contact region CT3 to form the third dummy structure D3. Each of the first to third dummy structures D1 to D3 may have a stepped shape. The mask pattern 29 may be removed after the above-descried processes.

Figure 7A:
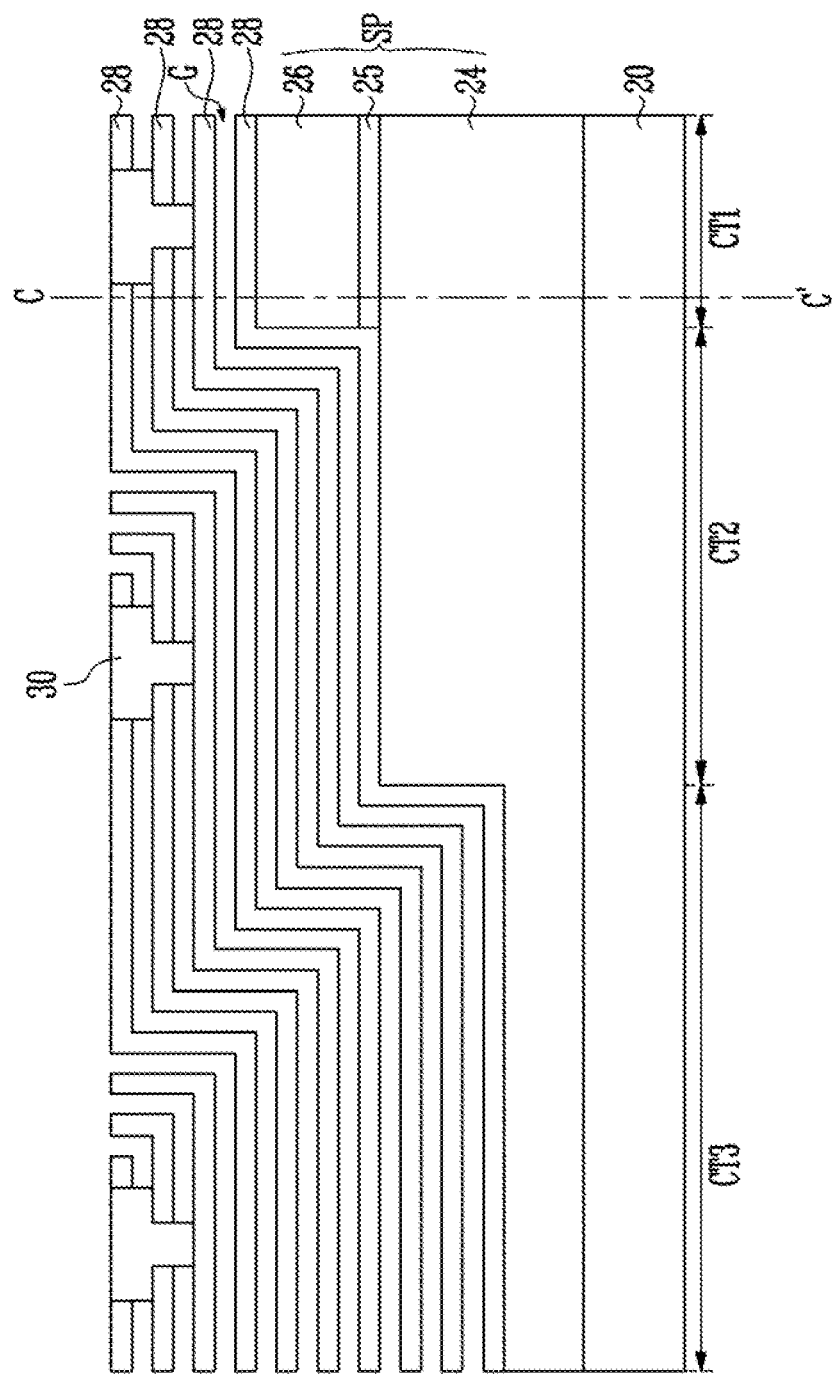
Figure 7B:
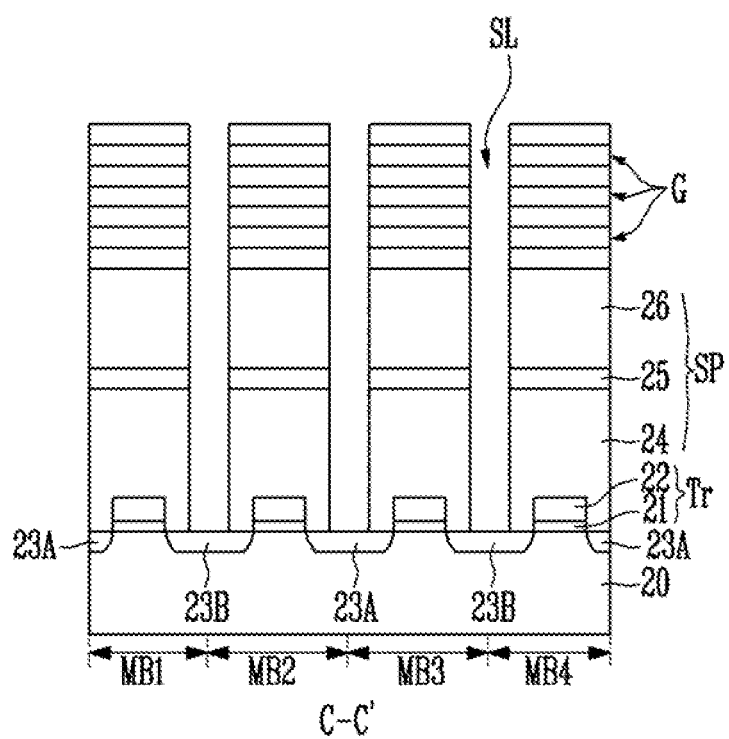

As illustrated in FIGS. 7A and 7B, an interlayer insulating layer 30 may be formed over the stepped first and second material layers 27 and 28. Subsequently, the slits SL may be formed through the interlayer insulating layer 30 and first and second material layers 27 and 28. In this manner, a plurality of stacked structures including the first and second material layers 27 and 28 that are alternately stacked and are separated by the slits SL may be defined.

Subsequently, the first material layers 27 may be removed through the slits SL to form a plurality of grooves G. For example, the first material layers 27 may be removed by a wet etch process. A portion of the first material layers 27 may remain in the stacked structures depending on distances of the slits SL, widths of the stacked structures, and etching conditions.

Figure 8A:
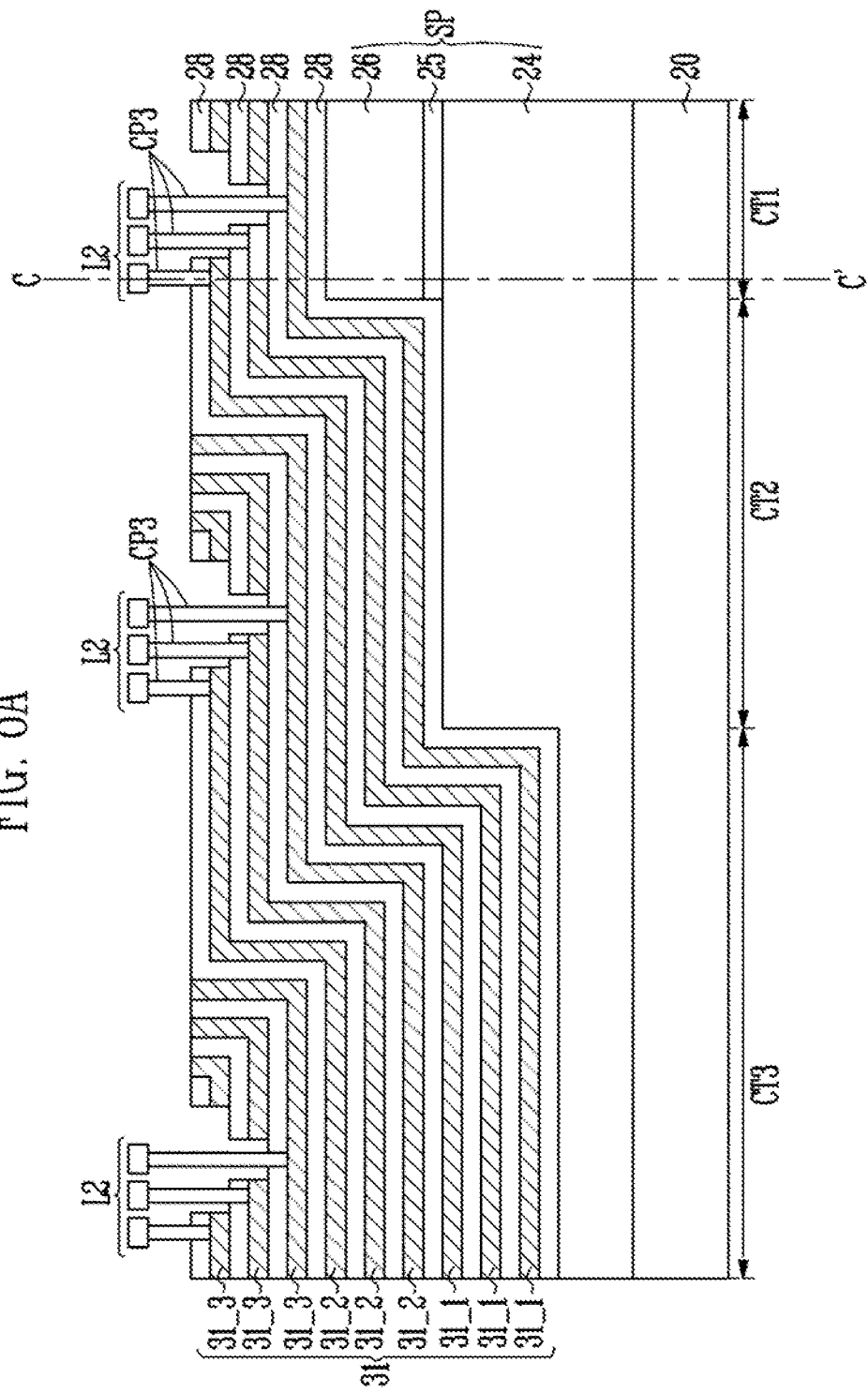
Figure 8B:
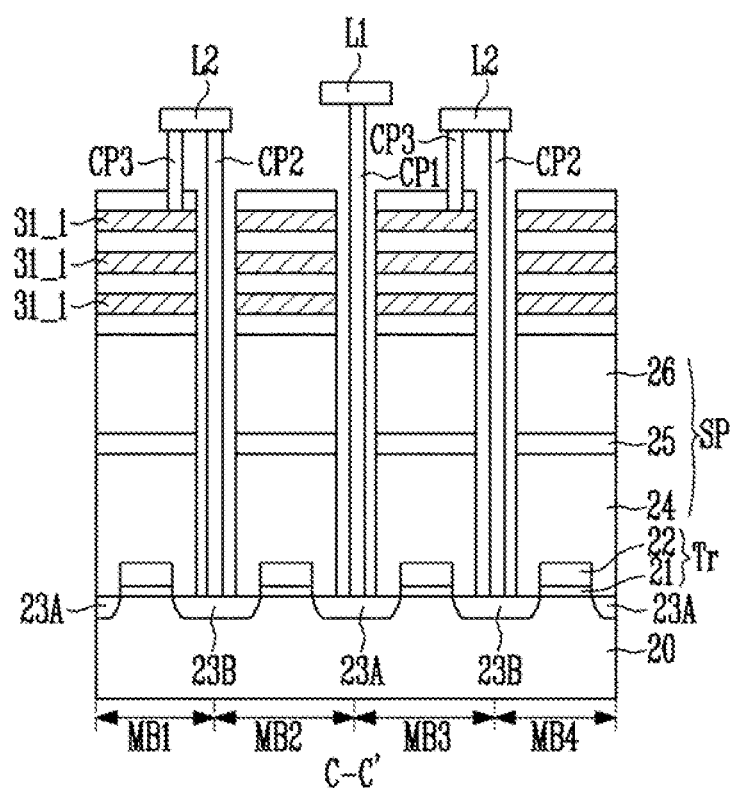

As illustrated in FIGS. 8A and 8B, first to third conductive layers 31 may be formed in the grooves G. Ends of first conductive layers 31_1 may be patterned stepwise in the first contact region CT1 to thereby form pad portions. The first dummy structure D1 may be substantially symmetrical with respect to the pad portions of the first conductive layers 31_1. Ends of second conductive layers 31_2 may be patterned stepwise in the second contact region CT2 to thereby define pad portions. The second dummy structure D2 may be substantially symmetrical with respect to the pad portions of the second conductive layers 31_2. In addition, ends of third conductive layers 31_3 may be patterned stepwise in the third contact region CT3 to thereby define pad portions. The third dummy structure D3 may be substantially symmetrical with respect to the pad portions of the third conductive layers 31_3.

Subsequently, the first to third contact plugs CP1 to CP3 may be formed. The first contact plugs CP1 may be coupled to the first junctions 23A of the transistors Tr, the second contact plugs CP2 may be coupled to the second junctions 23B of the transistors Tr, and the third contact plugs CP3 may be coupled to the first to third conductive layers 31. The first to third contact plugs CP1 to CP3 may be formed at the same time or by separate processes, depending on depths of the contact plugs.

Subsequently, the first and second lines L1 and L2 may be formed. The first lines L1 may be coupled to the first contact plugs CP1, and the second lines L2 may couple the second contact plugs CP2 and the third contact plugs CP3. The first and second lines L1 and L2 may have the same or different heights.

The above-described manufacturing processes may be partly changed depending on types of the first and second material layers 27 and 28. For example, when the first material layers 27 are conductive layers and the second material layers 28 are insulating layers, the process of forming the grooves G may be removed. Instead, a process of siliciding the first material layers 27 that are exposed through the slits SL, may be additionally performed. In another example, when the first material layers 27 include conductive layers and the second material layers 28 include sacrificial layers, the second material layers 28 may be removed instead of the first material layers 27 to thereby form the grooves G, and an insulating layer may be formed in the grooves G.

According to the above-described manufacturing process, the pad portions may be distributed in the contact regions CT1 to CT3. In addition, since the first and second material layers are stacked using the support body whose top surface has different heights in the contact regions CT1 to CT3, the number of times the stacked structure is patterned stepwise may be reduced. Therefore, a method of manufacturing a semiconductor device may be simplified, manufacturing costs may be reduced, and process failures may be reduced.

Figure 9:
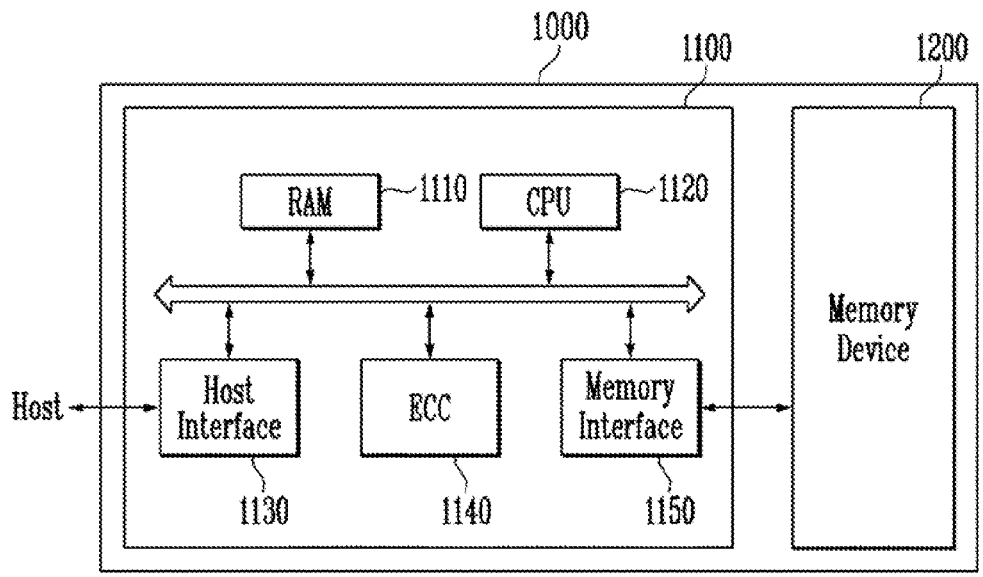
FIG. 9 is a block diagram of a memory system according to an embodiment of the present invention.

FIG. 9 is a block diagram of the configuration of a memory system according to an embodiment of the present invention.

As illustrated in FIG. 9, a memory system 1000 according to an embodiment of the present invention may include a memory device 1200 and a controller 1100.

The memory device 1200 may be used to store various data types such as text, graphic and software code. The memory device 1200 may be a non-volatile memory. The memory device 1200 may be the semiconductor device described above with reference to FIGS. 1A to 8B. In addition, the memory device 1200 may include a substrate on which a plurality of contact regions are defined, a plurality of transistors that are formed in the plurality of contact regions, a support body that is formed over the plurality of transistors and includes a top surface, portions of which have different heights in the plurality of contact regions, a plurality of stacked structures that are stacked over the support body and include a plurality of conductive layers, slits that are located between neighboring stacked structures, first lines that are coupled to first junctions of the transistors through the slits, and second lines that are coupled to second junctions of the transistors through the slits. Since the memory device 1200 is formed and manufactured in the above-described manner, a detailed description thereof will be omitted.

The controller 1100 may be couple to a host and the memory device 1200, and may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The host interface 1130 may be interface with the host. For example, the controller 1100 may communicate with the host through one of various interface protocols including a Universal Serial Bus (USB) protocol, a multimedia card (MMC) protocol, a peripheral component interconnection (PCI) protocol, a PCI express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data, externally transferred through the host interface 1130, or temporarily store data, transferred from the memory device 1200 through the memory interface 1150. In addition, the controller 1100 may further include ROM storing code data to interface with the host.

Figure 10:
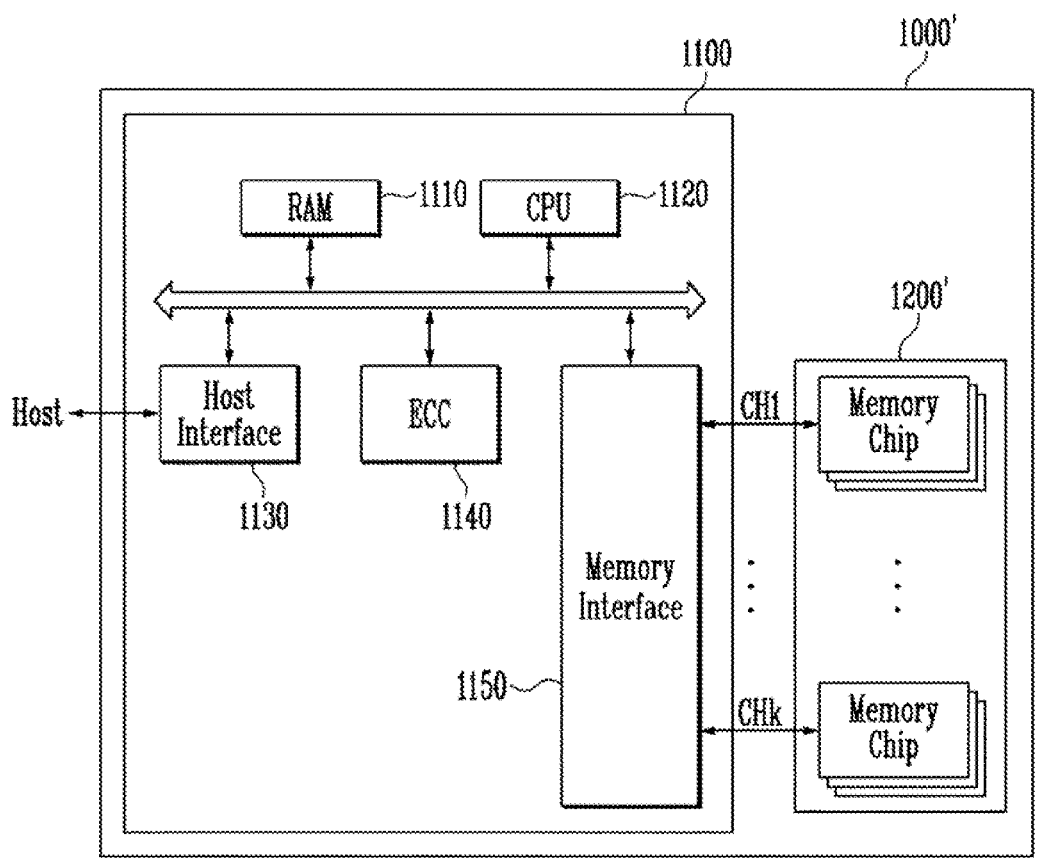
FIG. 10 is a block diagram of a memory system according to an embodiment of the present invention.

Since the memory system 1000 according to an embodiment of the present invention includes the memory device 1200 that is manufactured using a simplified method and has an improved degree of integration, data storage capacity of the memory system 1000 may be improved, FIG. 10 is a block diagram of the configuration of a memory system according to an embodiment of the present invention. Hereinafter, a description of common contents with the earlier described embodiment is omitted.

As illustrated in FIG. 10, a memory system 1000' according to an embodiment of the present invention may include a memory device 1200' and the controller 1100. In addition, the controller 1100 may include the RAM 1110, the CPU 1120, the host interface 1130, the ECC circuit 1140 and the memory interface 1150.

The memory device 1200' may be a non-volatile memory device. The memory device 1200' may be the semiconductor device described above with reference to FIGS. 1A to 8B. In addition, the memory device 1200' may include a substrate on which a plurality of contact regions are defined, a plurality of transistors that are formed in the plurality of contact regions, a support body that is formed over the plurality of transistors and includes a top surface, portions of which have different heights in the plurality of contact regions, a plurality of stacked structures that are stacked over the support body and include a plurality of conductive layers, slits that are located between neighboring stacked structures, first lines that are coupled to first junctions of the transistors through the slits, and second lines that are coupled to second junctions of the transistors through the slits. Since the memory device 1200' is formed and manufactured in the above-described manner, a detailed description thereof will be omitted.

In addition, the memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, according to an embodiment of the present invention, since the memory system 1000' includes the memory device 1200' that is manufactured using a simplified method and has an improved degree of integration, data storage capacity of the memory system 1000' may be improved. In addition, the data storage capacity of the memory system 1000' may be further increased by forming the memory device 1200' using a multi-chip package.

Figure 11:
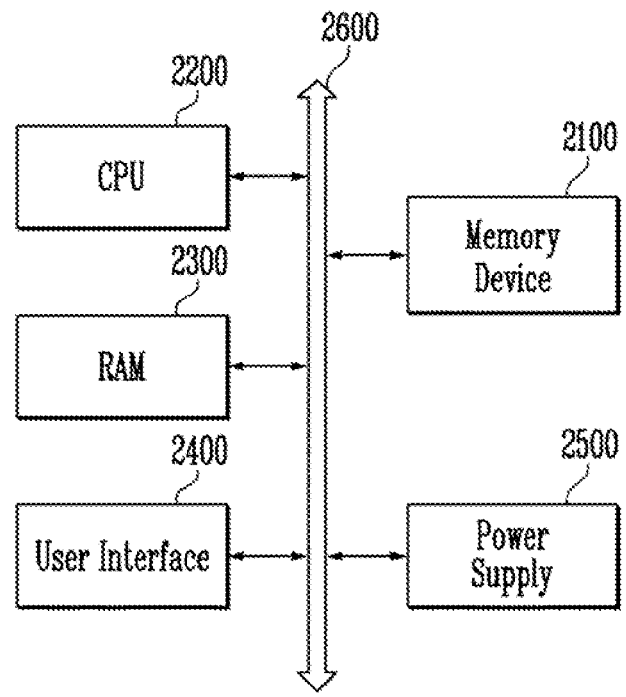
FIG. 11 is a block diagram of a computing system according to an embodiment of the present invention.

FIG. 11 is a block diagram of the configuration of a computing system according to an exemplary embodiment of the present invention. Hereinafter, a description of common contents with the earlier described embodiments is omitted.

As illustrated in FIG. 11, a computing system 2000 according to an embodiment of the present invention may include a memory device 2100, a CPU 2200, a random-access memory (RAM) 2300, a user interface 2400, a power supply 2500 and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400 and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may be the semiconductor memory device described above with reference to FIGS. 1A to 8B. The memory device 2100 may include a substrate on which a plurality of contact regions are defined, a plurality of transistors that are formed in the plurality of contact regions, a support body that is formed over the plurality of transistors and includes a top surface, portions of which have different heights in the plurality of contact regions, a plurality of stacked structures that are stacked over the support body and include a plurality of conductive layers, slits that are located between neighboring stacked structures, first lines that are coupled to first junctions of the transistors through the slits, and second lines that are coupled to second junctions of the transistors through the slits. Since the memory device 2100 is formed and manufactured in the above-described manner, a detailed description thereof will be omitted.

In addition, as described above with reference to FIG. 10, the memory device 2100 may be a multi-chip package composed of a plurality of memory chips.

The computing system 2000 having the above-described configuration may be one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, since the computing system 2000 according to an embodiment of the present invention includes the memory device 2100 that is manufactured using a simplified method and has an improved degree of integration, data storage capacity of the computing system 2000 may be increased.

Figure 12:
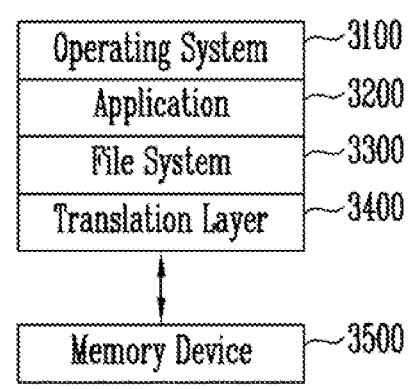
FIG. 12 is a block diagram of a computing system according to an embodiment of the present invention.

FIG. 12 is a block diagram of a computing system according to an embodiment of the present invention.

As illustrated in FIG. 12, a computing system 3000 according to an embodiment of the present invention ray include a software layer that has an operating system 3100 an application 3200, a file system 3300 and a translation layer 3400. In addition, the computing system 3000 may include a hardware layer such as a memory system 3500.

The operating system 3100 manages software and hardware resources of the computing system 3000. The operating system 3100 may control program execution of a central processing unit. The application 3200 may include various application programs executed by the computing system 3000. The application 3200 may be a utility executed by the operating system 3100.

The file system 3300 may refer to a logical structure configured to manage data and files present in the computing system 3000. The file system 3300 may organize files or data to be stored in the memory device 3500 according to rules. The file system 3300 may be determined depending on the operating system 3100 that is used in the computing system 3000. For example, when the operating system 3100 is a Microsoft Windows-based system, the file system 3300 may be a file allocation table (FAT) or an NT file system (NTFS). In addition, when the operating system 3100 is a Unix/Linux-based system, the file system 3300 may be an extended file system (EXT), a Unix file system (UFS) or a journaling file system (JFS).

FIG. 12 illustrates the operating system 3100, the application 3200, and the file system 3300 in separate blocks. However the application 3200 and the file system 3300 may be included in the operating system 3100.

The translation layer 3400 may translate an address to be suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL) or the like.

The memory device 3500 may be a non-volatile memory. The memory device 3500 may be the semiconductor memory device described above with reference to FIGS. 1A to 8B. In addition, the memory device 3500 may include a substrate on which a plurality of contact regions are defined, a plurality of transistors that are formed in the plurality of contact regions, a support body that is formed over the plurality of transistors and includes a top surface, portions of which have different heights in the plurality of contact regions, a plurality of stacked structures that are stacked over the support body and include a plurality of conductive layers, slits that are located between neighboring stacked structures, first lines that are coupled to first junctions of the transistors through the slits, and second lines that are coupled to second junctions of the transistors through the slits. Since the memory device 3500 is formed and manufactured in the above-described manner, a detailed description thereof will be omitted.

The computing system 3000 having the above-described configuration may be divided into an operating system layer that is operated in an upper layer region and a controller layer that is operated in a lower level region. The operating system 3100, the application 3200, and the file system 3300 may be included in the operating system layer and driven by an operation memory. In addition, the translation layer 3400 may be included in the operating system layer or the controller layer.

As described above, since the computing system 3000 according to an embodiment of the present invention includes the memory device 3500 manufactured using a simplified method and having an improved degree of integration, data storage capacity of the computing system 3000 may be improved.

A degree of integration of a semiconductor device may be improved by arranging pad portions of stacked conductive layers with efficiency by distributing the pad portions and locating switch devices under the pad portions. In addition, it may become easier to manufacture a semiconductor device.

While the present invention has been described with respect to the specific embodiments it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor device, comprising:
   a substrate on which a plurality of contact regions are defined;
   a plurality of transistors formed in the plurality of contact regions;
   a support body formed over the plurality of transistors and including a top surface, portions of which have different heights in the plurality of contact regions;
   a plurality of stacked structures including a plurality of conductive layers stacked over the support body;
   slits located between the plurality of stacked structures;
   first lines coupled to first junctions of the plurality of transistors through the slits; and
   second lines coupled to second junctions of the plurality of transistors through the slits.

2. The semiconductor device of claim further comprising:
   first contact plugs located in the slits and coupling the first lines and the first junctions;
   second contact plugs located in the slits and coupling the second lines and the second junctions; and
   third contact plugs located in the contact regions and coupling the second lines and the conductive layers.

3. The semiconductor device of claim 1, wherein the stacked structures extend in a first direction, the first lines extend in a second direction crossing the first direction, and the second lines extend in the first direction.

4. The semiconductor device of claim 1, wherein the second lines are formed over the stacked structures and have bent linear shapes.

5. The semiconductor device of claim 1, wherein the first lines are global word lines, and the second lines are local word lines.

6. The semiconductor device of claim 5, wherein the transistors are switching devices coupling the global word lines and the local word lines.

7. The semiconductor device of claim 1, wherein the slits are located at boundaries between neighboring stacked structures.

8. The semiconductor device of claim 1, wherein the support body has a stepped shape.

9. The semiconductor device of claim 1, wherein a top surface of each of the stacked structures has a stepped shape, and pad portions are defined at ends of the conductive layers.

10. The semiconductor device of claim 1, wherein the support body comprises:
    a first support body covering the transistors;
    a second support body formed over the first support body and having a smaller width than that of the first support body; and
    an etch stop layer interposed between the first support body and the second support body.

11. The semiconductor device of claim wherein the conductive layers include n-th conductive layers and n+1-th conductive layers stacked over the n-th conductive layers, where n is a natural number, and
    wherein the contact regions include an n-th contact region in which n-th pad portions of the n-th conductive layers are defined and an n+1-th contact region in which n+1-th pad portions of the n+1 th conductive layers are defined.

12. The semiconductor device of claim 11, further comprising:
    an n-th dummy structure located in the n-th contact region and having a symmetrical structure with respect to the n-th pad portions; and
    an n+1-th dummy structure located in the n+1-th contact region and having a symmetrical shape with respect to the n+1-th pad portions.

13. The semiconductor device of claim 11, wherein the n+1-th contact region has a greater width than that of the n-th contact region.

14. The semiconductor device of claim 11, wherein the portions of the top surface of the support body include an n-th portion located in the n-th contact region and an n+1-th portion located in the n+1-th contact region, and wherein the n+1-th portion of the top surface has a smaller height than that of the n-th portion of the top surface.

15. A method of manufacturing a semiconductor device, the method comprising:
    forming a plurality of transistors in a plurality of contact regions that are formed on a substrate;
    forming a support body over the plurality of transistors, wherein the support body includes a top surface, portions of which have different heights in the plurality of contact regions;
    forming a plurality of stacked structures including a plurality of conductive layers and a plurality of insulating layers, which are alternately stacked over the support body, wherein the plurality of stacked structures are separated by a plurality of slits from one another;
    forming first lines coupled to first junctions of the plurality of transistors through the plurality of slits; and
    forming second lines coupled to second junctions of the plurality of transistors through the plurality of slits.

16. The method of claim 15, further comprising:
    forming first contact plugs coupling the first lines and the first junctions through the slits;
    forming second contact plugs coupling the second lines and the second junctions through the slits; and
    forming third contact plugs in the contact regions, wherein the third contact plugs couple the second lines and the conductive layers.

17. The method of claim 15, further comprising:
    patterning the stacked structures so that a top surface of each of the stacked structures has a stepped shape.

18. The method of claim 15, wherein the forming of the plurality of stacked structures comprises:
    alternately forming first material layers and second material layers over the support body;
    planarizing a top surface of the first and second mate layers; and
    forming the slits passing through the first and second material layers.

19. The method of claim 15, wherein the forming of the support body comprises:
    forming a first material layer, constituting the support body, over the transistors;
    forming an each stop layer, constituting the support body, over the first material layer;
    forming a second material layer, constituting the support body, over the etch stop layer;
    forming a mask pattern over the second material layer, wherein the contact regions include an n-th contact region and an n+1-th contact region, and wherein the mask pattern covers a portion of the second material layer, in the n-th contact region, and exposes a portion of the second material layer, in the n+1-th contact region, where n is a natural number;
    etching the exposed portion of the second material layer by using the mask pattern as an etch barrier; and
    etching a portion of the etch stop layer, exposed through the etching of the exposed portion of the second material layer.

20. The method of claim 15, wherein the first lines are global word lines, the second lines are local word lines, and the transistors are switching devices coupling the global word lines and the local word lines.

* * * * *